(12) United States Patent
Kanaya

(10) Patent No.: US 8,159,292 B2
(45) Date of Patent: Apr. 17, 2012

(54) AMPLIFYING CIRCUIT

(75) Inventor: Masahito Kanaya, Ota (JP)

(73) Assignee: ON Semiconductor Trading Ltd., Hamilton (BM)

( * ) Notice: Subject to any disclaimer, the term of this patent is extended or adjusted under 35 U.S.C. 154(b) by 0 days.

(21) Appl. No.: 13/032,245

(22) Filed: Feb. 22, 2011

(65) Prior Publication Data

US 2011/0204972 A1 Aug. 25, 2011

(30) Foreign Application Priority Data

Feb. 22, 2010 (JP) ................................ 2010-036532

(51) Int. Cl.
*H03F 3/45* (2006.01)

(52) U.S. Cl. .......... 330/69; 330/260; 330/109; 381/120; 381/121; 381/122

(58) Field of Classification Search ............ 330/69, 330/260, 109; 381/120–122
See application file for complete search history.

(56) References Cited

U.S. PATENT DOCUMENTS

| | | | |
|---|---|---|---|
| 3,740,591 A * | 6/1973 | Butler et al. ................. | 333/165 |
| 4,441,084 A * | 4/1984 | Akagiri et al. ................ | 330/149 |
| 4,509,037 A * | 4/1985 | Harris ........................... | 341/143 |
| 5,705,950 A * | 1/1998 | Butler ............................ | 330/3 |
| 6,002,299 A * | 12/1999 | Thomsen ...................... | 330/9 |
| 7,522,735 B2 * | 4/2009 | Van Tassel .................... | 381/63 |

FOREIGN PATENT DOCUMENTS

JP 2009-232201 10/2009

OTHER PUBLICATIONS

Espacenet patent abstract for Japanese Publication No. 2009232201, Publication date Oct. 8, 2009 (1 page).

* cited by examiner

*Primary Examiner* — Patricia Nguyen

(74) *Attorney, Agent, or Firm* — Osha • Liang LLP

(57) ABSTRACT

To efficiently obtain two outputs including one at a normal level and the other at an excessive level. An input signal input to the negative input terminal of an operational amplifier (14) having a negative feedback path is amplified to output an output signal. Signal combining units (18, 20, 22) are provided for adding in a weighted manner a negative input terminal side signal obtained by combining the input signal input to the negative input terminal of the operational amplifier (14) and a feedback signal from the negative feedback path and the output signal from the operational amplifier to output a combined signal, so that two signals, namely the output signal from the operational amplifier (14) and the combined signal, are obtained.

6 Claims, 5 Drawing Sheets

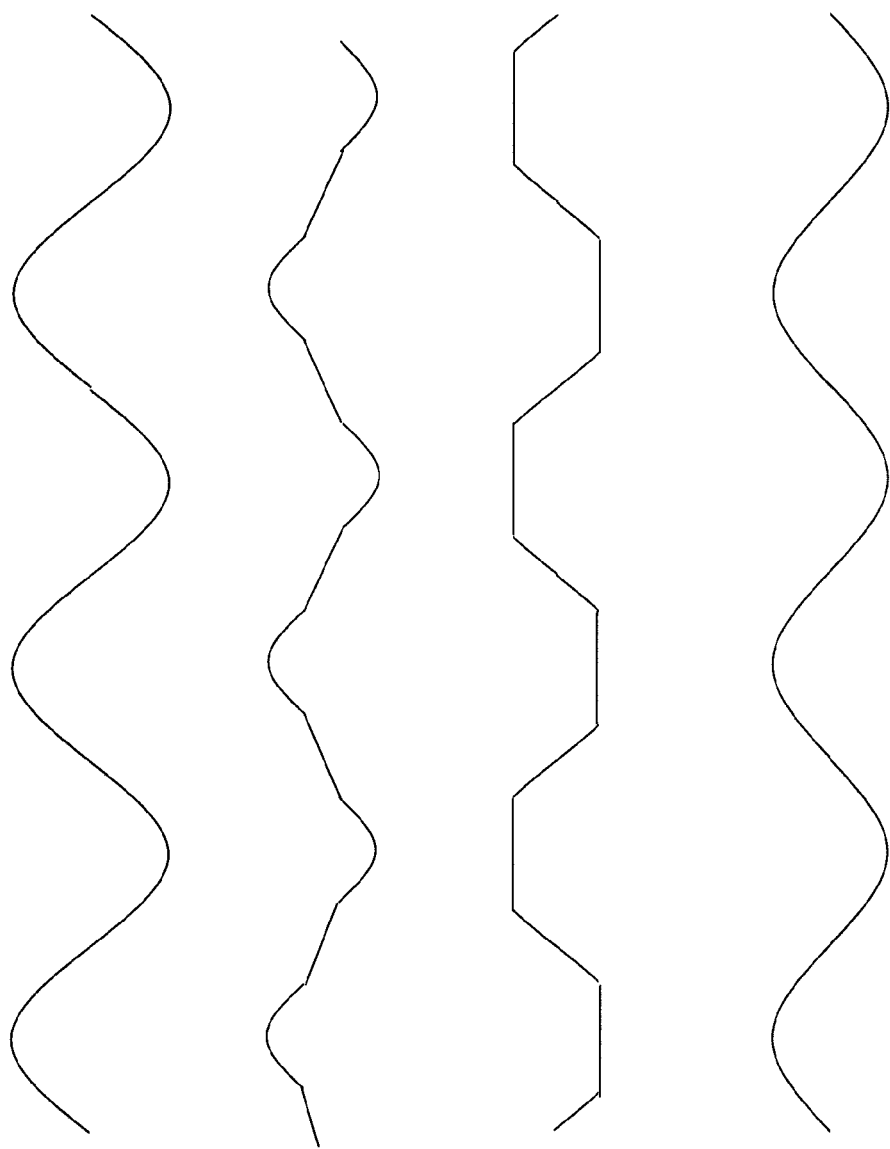

US 8,159,292 B2

AMPLIFYING CIRCUIT

CROSS-REFERENCE TO RELATED APPLICATION(S)

The entire disclosure of Japanese Patent Application No. 2010-036532 filed on Feb. 22, 2010, including specification, claims, drawings, and abstract, is incorporated herein by reference in its entirety.

BACKGROUND

1. Technical Field

The present invention relates to an amplifying circuit that utilizes an operational amplifier having a negative feedback path.

2. Background Art

Conventionally, there have been available amplifying circuits for signal amplification, which have been used for various purposes. For example, with microphone input for a portable phone, an audio processing circuit carries out a process for the input, and a pre-amplifier carries out first-stage amplification on the microphone input.

An electret condenser microphone (ECM) is often used for a microphone, and a pre-amplifier for such a microphone input outputs an electrical signal in accordance with the intensity of a sound, from large sound to small sound, input to the microphone. Such a pre-amplifier has the capability, in terms of a sound level (SPL: sound pressure level), of outputting a full scale output relative to an input of 120 dB SPL, and of having an SN ratio (a signal-to-noise ratio) of 60.5 dB or smaller relative to 94 dB SPL.

Related Art Document: Japanese Patent Laid-open Publication No. 2009-232201

Here, when a signal in excess of 120 dB SPL is input from a microphone (that is, an excessive input level), an output from the pre-amplifier resultantly exceeds the full scale, with the excessive portion being cut off. Such a large volume situation is not very common. However, it is preferable to obtain a pre-amplifier output without distortion even in such a situation. Suppose that an input signal level is 140 dB SPL, for example. This is larger by 20 dB (ten times) than the maximum value of an input level from a conventional microphone. Supposing that the amplitude (Vp-p) of an input signal of 120 dB SPL is 0.44 V, the amplitude of an input signal of 140 dB results in 4.4 V. However, a pre-amplifier comprising an operational amplifier of a voltage input type and using a 1.8 V batter as a power source cannot amplify an input signal having an amplitude of 4.4 V.

In view of the above, the pre-amplifier should be a current amplifying type that receives an input signal from a microphone via a negative input terminal of an operational amplifier. In this case, two operational amplifiers, including one for a normal level and the other for a large level, are provided to obtain an output signal for a normal input and an output signal for a large input via the respective outputs thereof. However, when operational amplifiers are arranged in parallel to distribute signals, an output signal from a normal level operational amplifier can hardly ensure sufficient accuracy. Meanwhile, when operational amplifiers are arranged in series so that an output relative to a large input is obtained at the first stage and the output relative to a large input is amplified to thereby obtain a normal level output, sufficient accuracy can be hardly maintained for the normal level output.

SUMMARY OF THE INVENTION

The present invention is characterized in comprising an operational amplifier having a negative feedback path for amplifying an input signal input to a negative input terminal and outputting an output signal; and a signal combining unit for adding in a weighted manner a negative input terminal side signal and the output signal from the operational amplifier to output a combined signal, the negative input terminal side signal being obtained by adding the input signal input to the negative input terminal of the operational amplifier and a feedback signal from the negative feedback path, wherein two signals, namely, the output signal from the operational amplifier and the combined signal, are obtained.

Further, preferably, when the input signal has a large amplitude and the output signal from the operational amplifier is distorted with a part thereof equal to or larger than an output upper limit being cut off, the signal combining unit may obtain a combined signal corresponding to a waveform of the input signal.

According to the present invention, two outputs including one for an excessive input and the other for a normal input can be efficiently obtained.

BRIEF DESCRIPTION OF THE DRAWINGS

FIG. 2A is a diagram showing a waveform at point a;
FIG. 2B is a diagram showing a waveform at point b;
FIG. 2C is a diagram showing a waveform at point c;
FIG. 5 is a diagram showing a waveform of an input signal;
FIG. 5A is a diagram showing a waveform at point a;
FIG. 5B is a diagram showing a waveform at point b;
and
FIG. 5C is a diagram showing a waveform at point c.

DETAILED DESCRIPTION

In the following, an embodiment of the present invention will be described with reference to the accompanying drawings.

Figure 1:
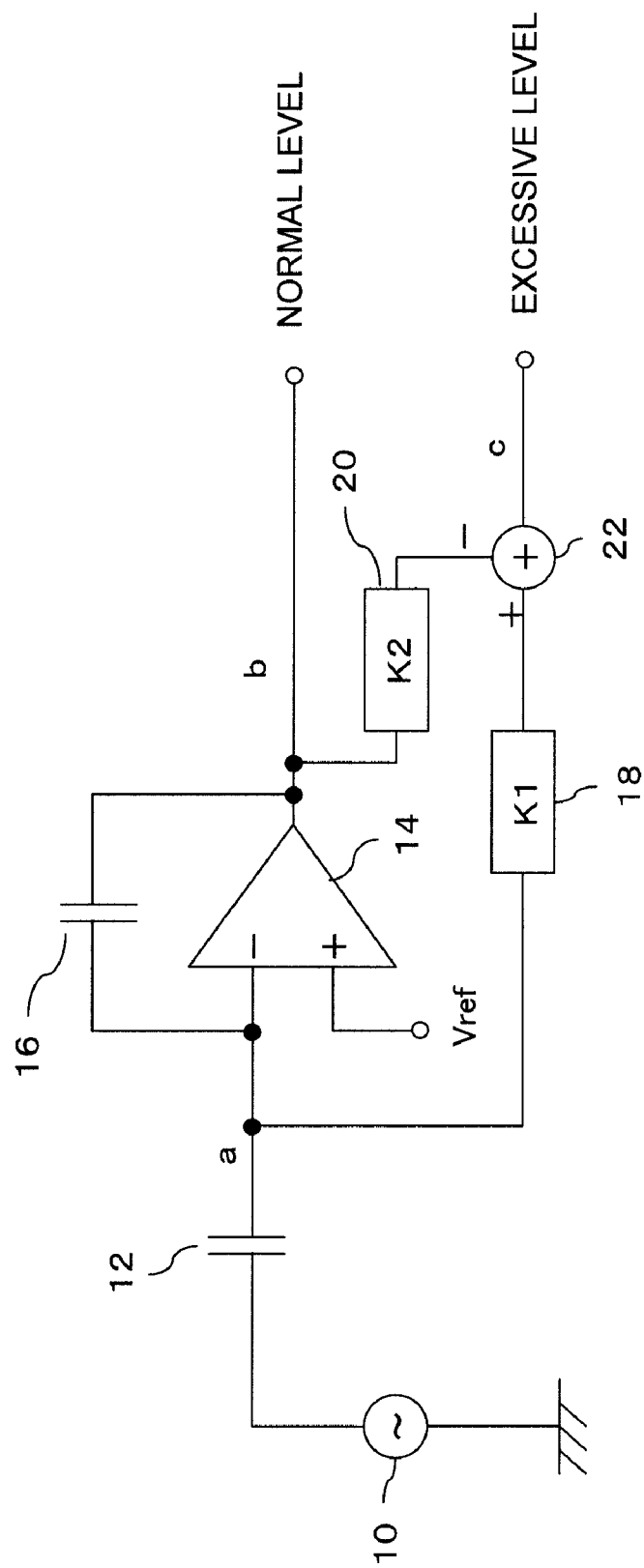
FIG. 1 is a diagram showing a structure of an embodiment.

FIG. 1 is a diagram showing a structure of an amplifying circuit according to an embodiment. A structure comprising a signal source 10 and a capacitor 12 constitutes an equivalent circuit of an electret condenser microphone (ECM), in which the signal source 10 and the capacitor 12 respectively correspond to a voltage signal generated by a sound pressure and to the capacitance of a microphone. An electrical signal generated by a sound pressure is input as a current signal to the negative input terminal of the operational amplifier 14.

The output terminal of the operational amplifier 14 is connected via a capacitor 16 to the negative input terminal of the same, so that negative feedback is established. The positive input terminal of the operational amplifier 14 receives a constant reference voltage Vref. That is, the voltage at the negative input terminal is virtually short-circuited to the positive input terminal. An input signal from the signal source 10 is amplified based on a capacitance value (impedance) ratio between the capacitors 12 and 16, and appears at the output of the operational amplifier 14, so that the output from the operational amplifier 14 becomes a normal level output. That is, the operational amplifier 14 functions as an amplifier having a capability of outputting a full scale output relative to an input of 120 dB SPL and of having an SN ratio of 60.5 dB or smaller relative to 94dB SPL.

Further, a multiplier 18 for multiplication by a coefficient K1 is connected to the negative input terminal of the operational amplifier 14; a multiplier 20 for multiplication by a coefficient K2 is connected to the output terminal of the operational amplifier 14; and outputs from the multipliers 18 and 20 are added to each other in an adder 22. That is, a signal appearing at the negative input terminal of the operational amplifier 14 and a signal appearing at the output terminal of the same are added to each other in a weighted manner in the adder 22, and a resultant signal becomes an excessive level output signal (combined signal).

Figure 2:
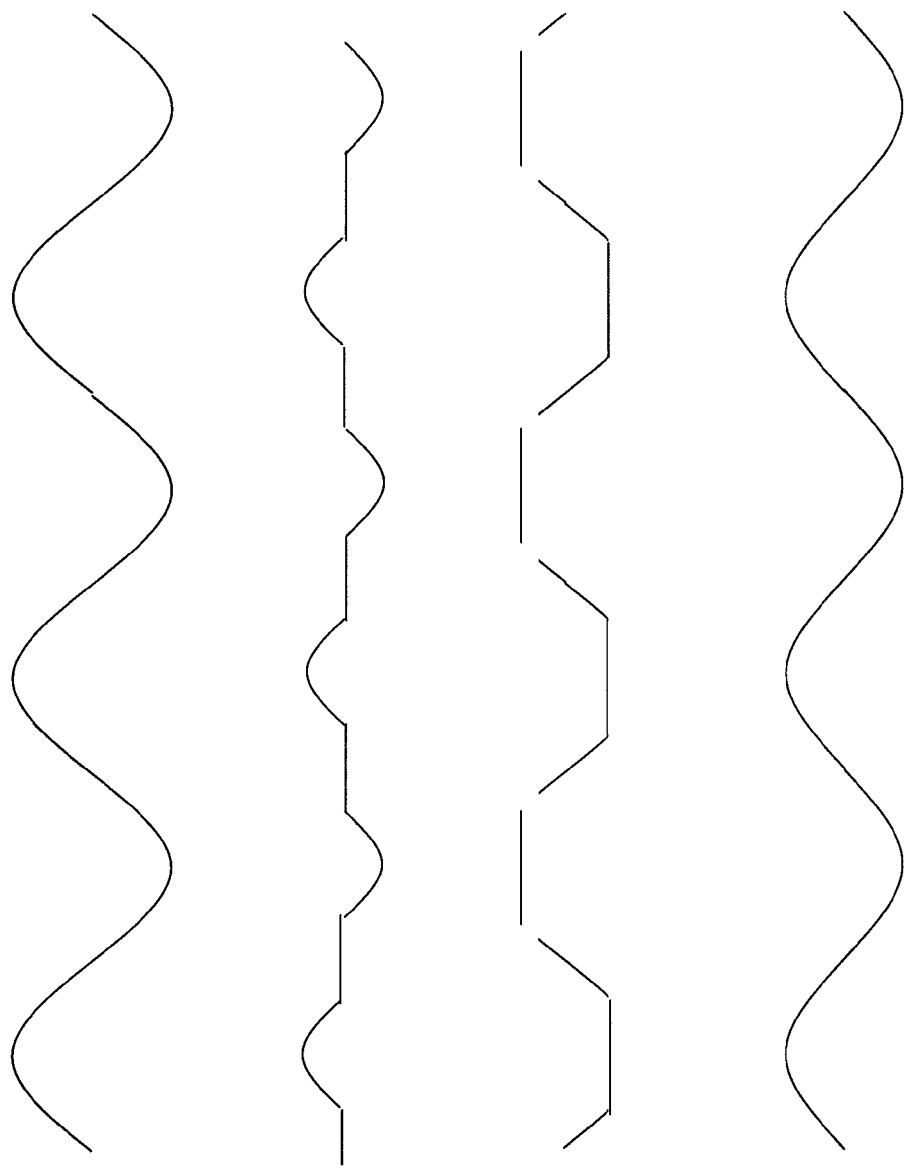
FIG. 2 is a diagram showing a waveform of an input signal.

An operation of the amplification device will be described with reference to FIGS. 2, 2A, 2B, and 2C. An input signal output from the signal source 10 will change according to a sound input, and when regarded as a target of processing by a circuit, can be expressed as an AC signal having an amplitude changing as shown in FIG. 2. An input signal is input via the capacitor 12 to the negative input terminal of the operational amplifier 14. The operational amplifier 14, the negative input terminal of which is virtually short-circuited to the positive input terminal thereof, is controlled so as to output an output signal basically having a voltage Vrel of a constant value. Therefore, a signal subjected to amplification based on a capacitance value ratio between the capacitors 12 and 16 is obtained at the output of the operational amplifier 14, as described above.

For example, supposing that the capacitance value of the capacitor 12 is denoted as Ci and that of the capacitor 16 is denoted as Cf, the gain g1 of the operational amplifier 14 can be denoted as $g1=-Ci/Cf$.

When an input signal at an excessive level (Vp-p) is input, the operational amplifier 14 cannot carry out a predetermined operation. Therefore, the maximum level of an output (point b) of the operational amplifier 24 is limited, and thus saturated as shown in FIG. 2B, so that a portion in excess of a predetermined value is cut off. Such an output signal causes a differential component with respect to the input signal, so that a voltage at the negative input terminal (point a) of the operational amplifier 14 presents a waveform reflecting a component being cut off, as shown in FIG. 2A. Note that the waveform of a voltage at the negative input terminal should be in accordance with the capacitance value ratio between the capacitors 12 and 16. Here, the negative input terminal generally has a parasitic capacitor, though the parasitic capacitor exerts no influence in normal operation in which the negative input terminal voltage is fixed. However, with a large level input, as a voltage in accordance with the difference between the input signal and a signal at the output terminal appears in the negative input terminal, the magnitude of the signal at the negative input terminal is affected by the parasitic capacitor. Supposing that the capacitance value of the parasitic capacitor is denoted as Cp, the gain g2 of the signal at the negative input terminal relative to the input signal is denoted as $g2=Ci/(Ci+Cp+Cf)$.

When the signal at the output terminal is clipped, as described above, a signal reflecting a signal that has been removed appears in the negative input terminal of the operational amplifier 14, as shown in FIG. 2A. Then, by multiplying appropriate coefficients K1, K2 in the multipliers 18, 20, respectively, and then adding the results in the adder 22, a signal, as shown in FIG. 2C, in accordance with the input signal can be obtained at point c.

As described above, the values of the coefficients K1, K2 may be determined such that while the gain of an output signal from the operational amplifier 14, shown in "b" in FIG. 2B, is g1and the gain of the signal at the input terminal, shown in "a", is g2, $K1 \cdot g1 = K2 \cdot g2$ is held, and the amplitude of the output signal becomes the full scale with respect to an input signal at the sound pressure level being 140 dB SPL. In actuality, while considering the influence of various characteristics of the circuit, the characteristics of the circuit may be measured in determination of the coefficients K1, K2. Further, preferably, the coefficients K1, K2 may be adapted to subsequent adjustment, so that the coefficients K1, K2 can be adjusted after detection of an output waveform.

As described above, according to the circuit in this embodiment, it is possible to obtain an output for an excessive level, using one normal level operational amplifier 14. Further, as extraction of an excess level output is basically achieved by simply extracting a voltage, the normal level operational amplifier 14 having a conventional structure can attain desired performance. In order to impart current capability in an excessive level output, a buffer amplifier or the like may be provided in an output path.

Figure 3:
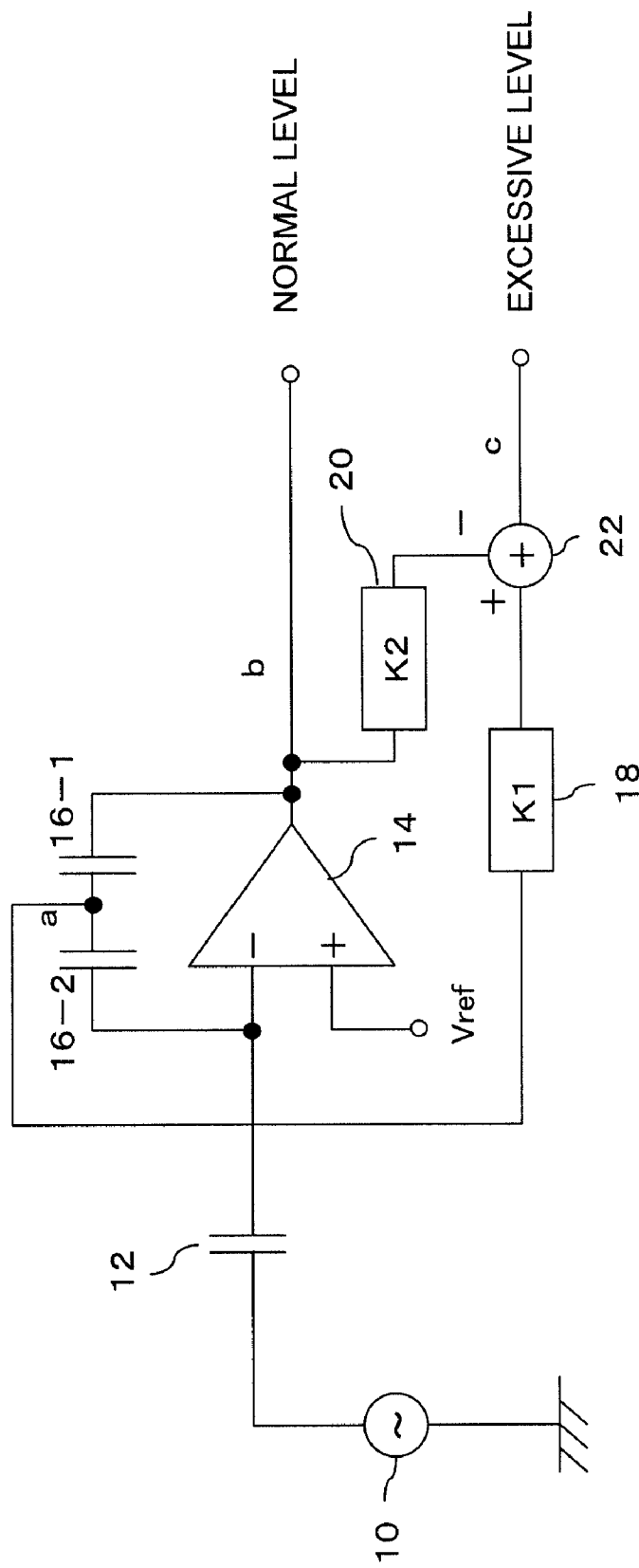
FIG. 3 is a diagram showing a structure of a modified example.

FIG. 3 shows a modified example. In this example, the capacitor 16 provided in the feedback path of the operational amplifier 14 is divided into two capacitors 16-1, 16-2, and a signal is extracted from a midpoint between the capacitors 16-1, 16-2 and input to the multiplier 18. As the gain g2 of a signal appearing at the input terminal of the operational amplifier 14 is determined based on the capacitance of the capacitors 12, 16, and so forth, dividing the capacitor 16 enables adjustment of the magnitude of a signal to be extracted, based on the capacitance values of the capacitors 16-1, 16-2. Basically, supposing that the input and output signals are AC signals, as a signal appearing at the input terminal of the operational amplifier 14 when a signal at an excessive level is input is obtained according to the capacitance values of the respective capacities, it is possible to obtain a signal having a desired magnitude by desirably changing the capacitance values of the capacitors 16-1, 16-2.

Figure 4:
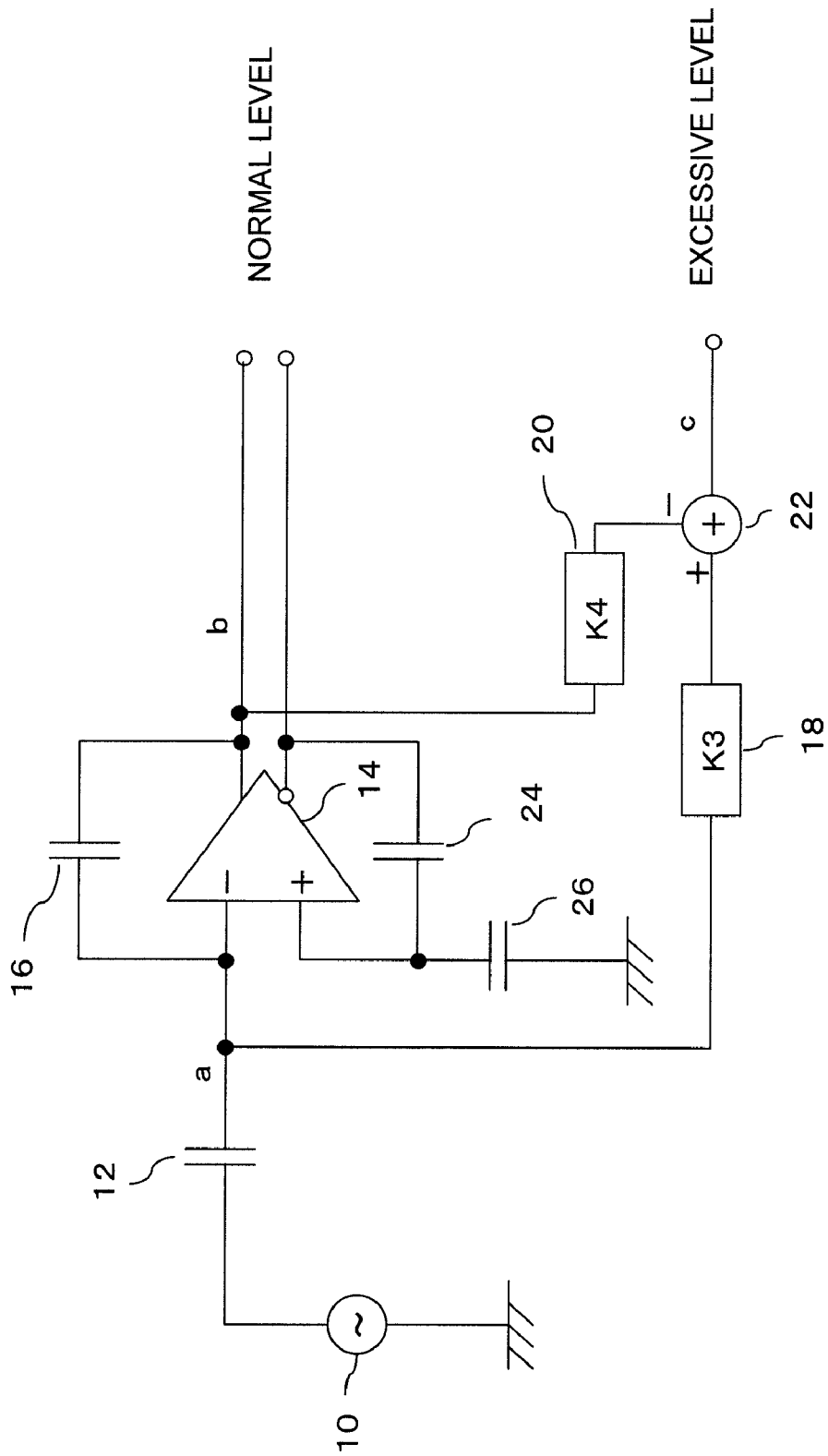
FIG. 4 is a diagram showing a structure of another modified example.

FIG. 4 shows another modified example. In this example, the operation amplifier 14 is a fully differential type, having a non-inverted output in addition to an inverted output. The non-inverted output is connected via a capacitor 24 to the positive input terminal, which is grounded via a capacitor 26. As a result, a pair of outputs having 180° different phases can be obtained as normal level outputs.

In this circuit as well, when a signal at an excessive level is input, a signal corresponding to an excessive portion appears at the negative input terminal of the operational amplifier 14. Note that a signal at the positive input terminal is a signal obtained by dividing an out put from the non-inverted output by the capacitors 24, 26, while a signal at the negative input terminal (point b) is a signal obtained by adding a signal obtained upon input of an excessive level signal to the signal at the positive input terminal, as shown in FIG. 5B, that is, a signal including an output signal when not being clipped, partially added thereto. Therefore, by appropriately setting the coefficients K3, K4 in the multipliers 18, 20, it is possible to similarly obtain a desired output signal for an excessive level. Note that it is possible to input an output from the non-inverted output of the operational amplifier 14 to the multiplier 20. In this case, an output from the amplifier 20 is input as a positive value to the adder 22. FIG. 5 shows an input signal; FIG. 5A shows a signal at point a (the negative input terminal of the operational amplifier 14); FIG. 5B shows a signal at point b (the output terminal of the operational amplifier); and FIG. 5C shows a signal at point c (the output terminal of the adder 22).

What is claimed is:
1. An amplifying circuit, comprising:
an operational amplifier having a negative feedback path, for amplifying an input signal input to a negative input terminal and outputting an output signal; and signal combining means for adding in a weighted manner a negative input terminal side signal and the output signal output from the operational amplifier to output a combined signal, the negative input terminal side signal being obtained by adding the input signal input to the negative input terminal of the operational amplifier and a feedback signal from the negative feedback path, wherein two signals, namely, the output signal output from the operational amplifier and the combined signal output from the signal combining means, are obtained.

2. The amplifying circuit according to claim 1, wherein when the input signal has a large amplitude and the output signal from the operational amplifier is distorted with a part thereof equal to or larger than an output upper limit being cut off, the signal combining means obtains a combined signal corresponding to a waveform of the input signal.

3. The amplifying circuit according to claim 1, wherein the input signal is a signal from an equivalent circuit of an electret condenser microphone, the equivalent circuit being formed by a serially connected AC signal source and capacitor, a capacitor is provided in the negative feedback path of the operational amplifier, and the negative input terminal side signal is extracted from the negative input terminal of the operational amplifier.

4. The amplifying circuit according to claim 1, wherein the signal combining means includes a first multiplying circuit for multiplying the negative input terminal side signal by a coefficient K1, a second multiplying circuit for multiplying the output signal from the operational amplifier by a coefficient K2, and an adder for adding an output from the first multiplying circuit and an output from the second multiplying circuit.

5. The amplifying circuit according to claim 1, wherein the input signal is a signal from an equivalent circuit of an electret condenser microphone, the equivalent circuit being formed by a serially connected AC signal source and capacitor, two capacitors are provided in the negative feedback path of the operational amplifier, and the negative input terminal side signal is extracted from a mid-connection point between the two capacitors provided in the negative feedback path.

6. The amplifying circuit according to claim 1, wherein the input signal is a signal from an equivalent circuit of an electret condenser microphone, the equivalent circuit being formed by a serially connected AC signal source and capacitor, the operational amplifier is fully differential type, and has an inverted output terminal and a non-inverted output terminal, the inverted output terminal is connected via a capacitor to the negative input terminal, and the non-inverted output terminal is connected via a capacitor to a positive input terminal that is grounded via a capacitor.

* * * * *